United States Patent
Sowlati (10) Patent No.: US 7,366,484 B2
(45) Date of Patent: Apr. 29, 2008

(54) SYSTEMS AND METHODS FOR ADJUSTING THE BIAS LEVEL OF A MIXER IN A TRANSMITTER

(75) Inventor: Tirdad Sowlati, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 354 days.

(21) Appl. No.: 10/861,870

(22) Filed: Jun. 4, 2004

(65) Prior Publication Data

US 2005/0272397 A1 Dec. 8, 2005

(51) Int. Cl.
*H04B 1/04* (2006.01)
(52) U.S. Cl. .................. 455/127.2; 455/115.1
(58) Field of Classification Search .. 455/232.1–253.2, 455/67.11, 115.1, 115.3, 226.1, 226.2, 226.3, 455/127.1, 127.2; 330/285, 278
See application file for complete search history.

(56) References Cited

U.S. PATENT DOCUMENTS

| | | | |
|---|---|---|---|
| 5,886,547 A * | 3/1999 | Durec et al. ................. 327/113 |
| 6,429,690 B1 * | 8/2002 | Castellucci et al. .......... 326/115 |
| 6,564,043 B2 * | 5/2003 | Rauhala .................... 455/251.1 |
| 6,650,883 B1 * | 11/2003 | Stephane et al. ............ 455/313 |
| 6,670,901 B2 * | 12/2003 | Brueske et al. .............. 341/139 |
| 6,807,406 B1 * | 10/2004 | Razavi et al. ................ 455/313 |
| 2003/0119473 A1 * | 6/2003 | Smith et al. ................. 455/326 |
| 2003/0141932 A1 * | 7/2003 | Toyota et al. ................ 330/285 |
| 2004/0183598 A1 * | 9/2004 | Behzad ....................... 330/253 |
| 2004/0203983 A1 * | 10/2004 | Klomsdorf et al. .......... 455/522 |
| 2004/0242170 A1 * | 12/2004 | Gilbert ...................... 455/127.1 |
| 2005/0026564 A1 * | 2/2005 | Haub et al. ............... 455/67.11 |
| 2005/0221790 A1 * | 10/2005 | Persico et al. ............ 455/343.2 |
| 2006/0040617 A1 * | 2/2006 | Haub et al. ............... 455/67.13 |

* cited by examiner

*Primary Examiner*—Blane J. Jackson (57) ABSTRACT

A mixer having dynamic biasing, comprises a mixer configured to receive a local oscillator (LO) reference signal and a radio frequency (RF) data signal, and a bias control circuit configured to reduce bias current from the mixer under a low power condition.

13 Claims, 5 Drawing Sheets

SYSTEMS AND METHODS FOR ADJUSTING THE BIAS LEVEL OF A MIXER IN A TRANSMITTER

BACKGROUND OF THE INVENTION

1. Field of the Invention

This invention relates generally to mixer circuit architecture in a wireless portable communication device. More particularly, the invention relates to a mixer having dynamic biasing in which the level of the bias signal supplied to a mixer is varied based on system performance requirements.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset. The different modulation and transmission schemes each have advantages and disadvantages.

As these mobile communication systems have been developed and deployed, many different standards, to which these systems must conform, have evolved. For example, in the United States, third generation portable communications systems comply with the IS-136 standard, which requires the use of a particular modulation scheme and access format. In the case of IS-136, the modulation scheme can be 8-quadrature phase shift keying (8QPSK), offset π/4 differential quadrature phase shift keying (π/4-DQPSK) or variations thereof and the access format is TDMA.

In Europe, the global system for mobile communications (GSM) standard requires the use of the gaussian minimum shift keying (GMSK) modulation scheme in a narrow band TDMA access environment, which uses a constant envelope modulation methodology. The GSM communication standard has been further developed into what is referred to as the enhanced data rates for GSM evolution, referred to as EDGE.

One of the advances in portable communication technology is the move toward the implementation of a low intermediate frequency (IF) transmitter and receiver and a direct conversion transmitter and receiver (DCR). A low IF receiver converts a radio frequency (RF) signal to an intermediate frequency that is lower than the IF of a convention receiver. A direct conversion receiver downconverts a radio frequency (RF) received signal directly to baseband (DC) without first converting the RF signal to an intermediate frequency (IF). One of the benefits of a direct conversion receiver is the elimination of costly filter components used in systems that employ an intermediate frequency conversion.

Regardless of the type of transceiver used in the system, one or more mixers are used to upconvert the transmit signal to an RF level and to downconvert the received RF signal. A mixer combines the RF signal with a reference signal, referred to as a "local oscillator," or "LO" signal. The resultant signal is the received signal at a different, and, in the case of a downconverter, typically lower, frequency. The performance required from the mixer generally increases at increased power levels. For example, at high power levels where linearity and noise requirements are more stringent, the mixer needs to provide increased performance. This requires that high current be supplied to the mixer. However, it is desirable to reduce the current supplied to the mixer at lower power levels, where the linearity and noise requirements of the system are less stringent than at high power levels.

Therefore, it would be desirable to reduce the power consumed by a mixer when linearity and noise requirements are relaxed.

SUMMARY

Embodiments of the invention include a mixer having dynamic biasing, comprising a mixer configured to receive a local oscillator (LO) reference signal and a radio frequency (RF) data signal, and a bias control circuit configured to reduce bias current to the mixer under a low power condition.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the mixer having dynamic biasing can be implemented in any communication device employing a mixer.

The mixer having dynamic biasing can be implemented in hardware, software, or a combination of hardware and software. When implemented in hardware, the mixer having dynamic biasing can be implemented using specialized hardware elements and logic. When the mixer having dynamic biasing is implemented partially in software, the software portion can be used to control the mixer components so that various operating aspects can be software-controlled. The software can be stored in a memory and executed by a suitable instruction execution system (microprocessor). The hardware implementation of the mixer having dynamic biasing can include any or a combination of the following technologies, which are all well known in the art: discreet electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the mixer having dynamic biasing comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
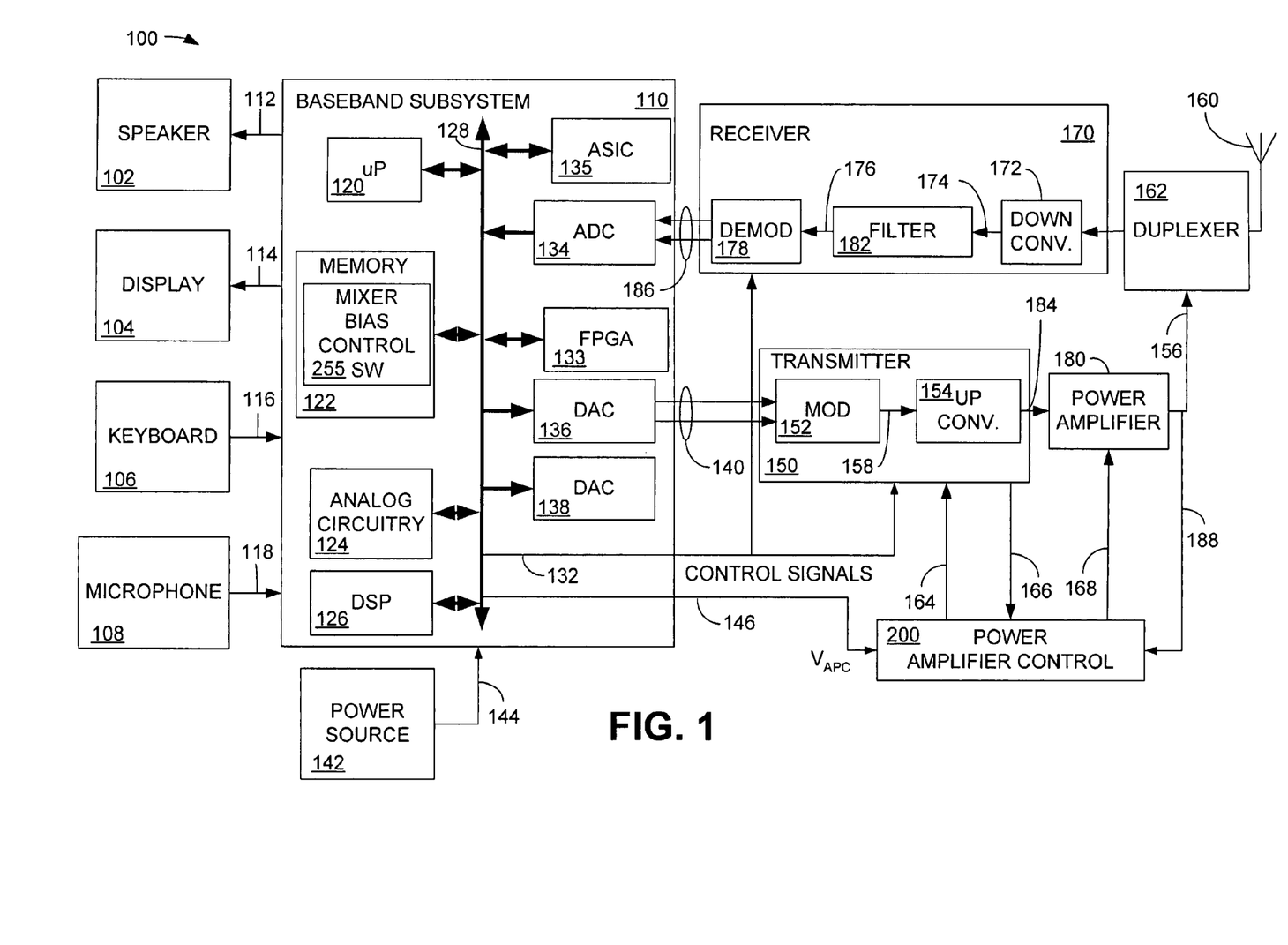
FIG. 1 is a block diagram illustrating a simplified portable transceiver including a power amplifier control element including a mixer having dynamic biasing.

FIG. 1 is a block diagram illustrating a simplified portable transceiver 100 including a power control element having a mixer with dynamic biasing. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication handset such as a mobile cellular-type device. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the mixer having dynamic biasing is implemented, the baseband subsystem 110 may also include an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150 and receiver 170 via connection 132 and provides a power control signal, referred to as $V_{APC}$, to a power amplifier control element 200 via connection 146. The acronym "APC" refers to automatic power control. The control signals on connections 132 and 146 may originate from the DSP 126, the ASIC 135, the FPGA 133, or from microprocessor 120, and are supplied to a variety of connections within the transmitter 150, receiver 170 and the power amplifier control element 200. It should be noted that, for simplicity, only the basic components of portable transceiver 100 are illustrated herein. The control signals provided by the baseband subsystem 110 control the various components within the transmitter 150 and the receiver 170. Further, the function of the transmitter 150 and the receiver 170 may be integrated into a transceiver.

If portions of the mixer having dynamic biasing are implemented in software that is executed by the microprocessor 120, the memory 122 will also include mixer bias control software 255. The mixer bias control software 255 comprises one or more executable code segments that can be stored in the memory and executed in the microprocessor 120. Alternatively, the functionality of the mixer bias control software 255 can be coded into the ASIC 135 or can be executed by the FPGA 133. Because the memory 122 can be rewritable and because the FPGA 133 is reprogrammable, updates to the mixer bias control software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information in connection 140 and provides a modulated signal via connection 158 to upconverter 154. The upconverter 154 transforms the modulated signal on connection 158 to an appropriate transmit frequency and provides the upconverted signal to a power amplifier 180 via connection 184. The power amplifier amplifies the signal to an appropriate power level for the system in which the portable transceiver 100 is designed to operate. Details of the modulator 152 and the upconverter 154 have been omitted for simplicity, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed.

The power amplifier 180 supplies the amplifier signal via connection 156 to duplexer 162. The duplexer comprises a filter pair that allows simultaneous passage of both transmit signals and receive signals, as known to those having ordinary skill in the art. The transmit signal is supplied from the duplexer 162 to the antenna 160.

A portion of the power of the signal from the power amplifier 180 is coupled via connection 188 to the power amplifier control element. Using the power control signal, $V_{APC}$, received via connection 146, the power amplifier control element 200 determines the appropriate power level at which the power amplifier operates to amplify the transmit signal. The power amplifier control element 200 also includes a mixer having dynamic biasing. The power amplifier control element receives information signals from the transmitter 150 via connection 166 and provides information to the transmitter via connection 164. The power amplifier control element 200 also provides a power control signal to the power amplifier 180 via connection 168. The power amplifier control element 200 will be described in greater detail below.

A signal received by antenna 160 will be directed from the duplexer 162 to the receiver 170. The receiver 170 includes a downconverter 172, a filter 182, and a demodulator 178. If implemented using a direct conversion receiver (DCR), the downconverter 172 converts the received signal from an RF level to a baseband level (DC). Alternatively, the received RF signal may be downconverted to an intermediate frequency (IF) signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
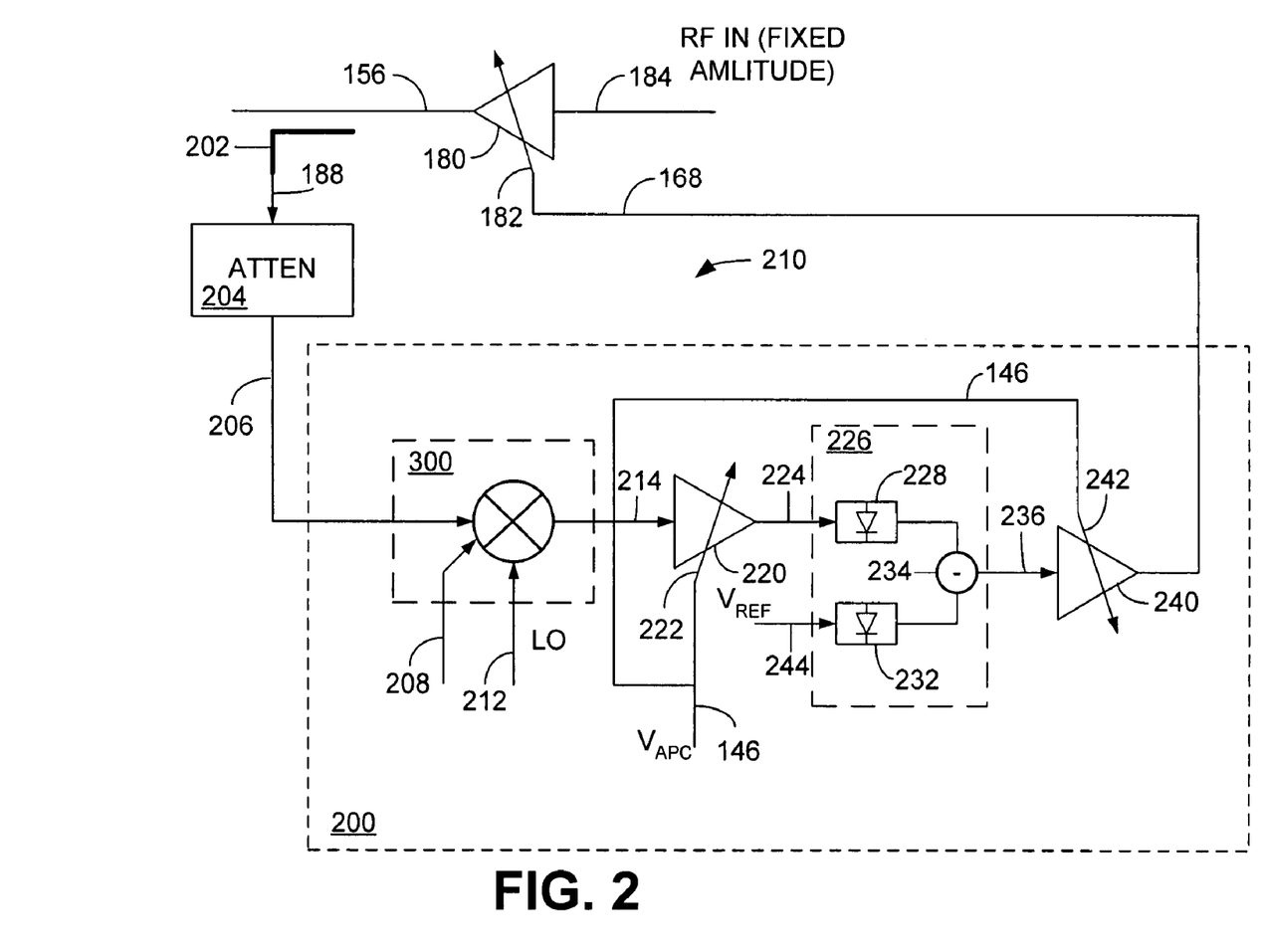
FIG. 2 is a block diagram illustrating the power amplifier control element of FIG. 1.

FIG. 2 is a block diagram illustrating the power amplifier control element 200 of FIG. 1. The power amplifier 180 receives a fixed amplitude radio frequency (RF) input signal via connection 184. The output of the power amplifier 180 on connection 156 is supplied to the duplexer 162 (FIG. 1). A portion of the output power on connection 156 is diverted via the coupler 202 onto connection 188. The coupler 202 samples the output power on connection 156 and supplies a portion of the power on connection 156 via connection 188 to an attenuator 204.

The attenuator 204 attenuates the signal on connection 188 and supplies a sampled output power signal on connection 206. For example, the attenuator 204 may reduce the power on connection 188 by a factor of, for example, 10 or 100. The attenuator 204 is a linear attenuator providing, in this example, approximately 30 dB attenuation.

The output of the attenuator 204 on connection 206 is supplied to the power amplifier control loop 210. The power amplifier control loop (sometimes referred to as an amplitude modulation (AM) control loop), comprises a mixer 300, an intermediate frequency (IF) variable gain amplifier (IF VGA) 220, a comparator 226 and a baseband (BB) variable gain amplifier (BB VGA) 240.

The IF signal on connection 206 is supplied to the mixer 300. The mixer 300 also receives a local oscillator (LO) reference signal via connection 212. The operation of the mixer 300 is controlled by a bias signal supplied on connection 208. As will be described in greater detail below, the level of the mixer bias current signal on connection 208 is controlled by the level of a baseband control signal referred to as the automatic power control signal ($V_{APC}$) The $V_{APC}$ signal determines the output power of the power amplifier 180, and is also used to derive a bias control signal for the mixer 300.

The output of the mixer 300 on connection 214 is an intermediate frequency (IF) signal and is supplied to the IF VGA 220. The IF VGA 220 receives the control signal, $V_{APC}$, via connection 146 and controls the output of the power amplifier 180.

For example, when the gain of the IF VGA is low, the output of the power amplifier 180 is high. Conversely, if the gain of the IF VGA is high, the output of the power amplifier 180 is low. The $V_{APC}$ signal is supplied via connection 146 from the baseband subsystem (FIG. 1) to the control input 222 of the IF VGA 220. The output of the IF VGA 220 on connection 224 is supplied to a comparator 226. The comparator receives the output of the IF VGA 220 and a reference voltage signal ($V_{REF}$) on connection 244. The comparator comprises a pair of diode detectors 228 and 232, the output of each being supplied to a subtractor 234. The output of the subtractor 234 is an error signal on connection 236 that defines the difference between the output of the IF VGA 220 and the voltage reference signal on connection 244. The error signal on connection 236 is supplied to the BB VGA 240. The BB VGA 240 also receives the $V_{APC}$ signal on connection 146 at its control input 242. The BB VGA 240 provides control loop stability and has a constant gain. The response of the BB VGA is opposite the response of the IF VGA 220. The output of the BB VGA 240 on connection 168 is supplied to the control input 182 of the power amplifier 180. In this manner, the output power of the power amplifier 180 is controlled using the power amplifier control loop 210.

In accordance with an embodiment of the invention, the output power of the power amplifier 180 specifies the required linearity of the components in the power control loop 210. The linearity requirements of the mixer 300 can be reduced dB per dB as the average output power of the power amplifier is reduced. The bias control signal supplied to the mixer 300 via connection 208 is varied based on the value of the power amplifier control signal, $V_{APC}$.

In this manner, the $V_{APC}$ signal is used to control the current supplied to the mixer via connection 208. The $V_{APC}$ signal controls the gain of the IF VGA 220 and the BB VGA 240 in what is referred to as a "linear-in-dB" relationship. By knowing the slope of the gain control in the IF VGA 220 as a function of $V_{APC}$, and how this gain is used to control power amplifier output power, the relationship between the mixer linearity and $V_{APC}$ is derived. It is desirable to step down the current supplied to the mixer 300 at low power amplifier output levels when the linearity required in the mixer 300 is low. In other words, high current is required for linearity, but only for high power levels.

The relationship between $V_{APC}$ and the power amplifier output is logarithmic. If $V_{APC}$ is linear, the output of the power amplifier will change logarithmically. In this manner, the mixer current can be changed using the $V_{APC}$ signal. The $V_{APC}$ signal is used to create a linear-in-dB function for reducing the current supplied to the mixer 300 in situations when the power amplifier is operating at low power levels. In this variable mode, the bias current supplied to the mixer is changed automatically, depending upon how much linearity is desired.

Figure 3:
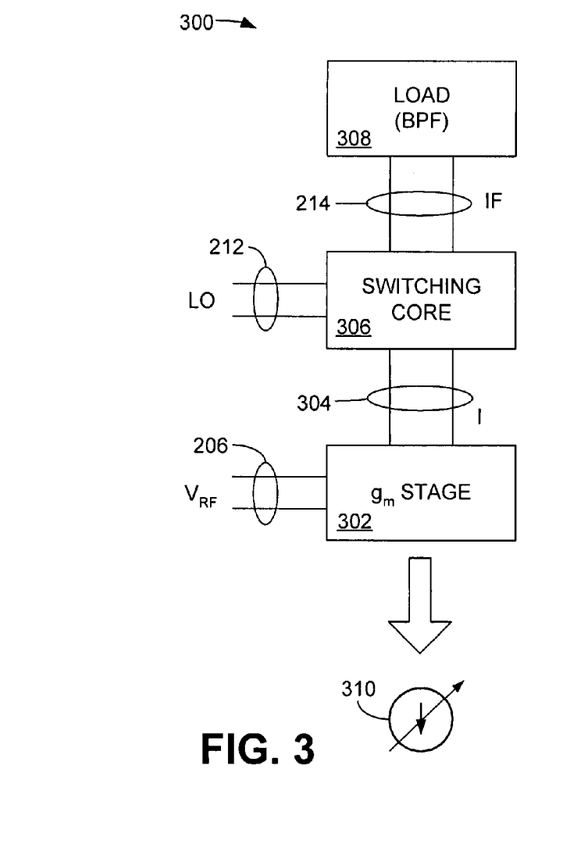
FIG. 3 is a schematic diagram illustrating the mixer of FIG. 2.

FIG. 3 is a block diagram illustrating the mixer 300 of FIG. 2. The mixer 300 comprises a switching core 306, a load (implemented as a band pass filter (BPF)) 308 and a $g_m$ stage 302. In accordance with this embodiment of the mixer having dynamic biasing, an adjustable current source 310 changes the current flowing in the $g_m$ stage 302. The $g_m$ stage 302 receives a radio frequency voltage signal, $V_{RF}$, via connection 206 and provides a current signal, I, via connection 304. Essentially, the $g_m$ stage 302 functions as a voltage to current converter. In accordance with an embodiment of the mixer having dynamic biasing, the current through the $g_m$ stage 302 is altered using the adjustable current source 310, as will be described below with respect to FIG. 4. The output of the $g_m$ stage 302 on connection 304 is supplied to the switching core 306. The switching core 306 also receives the local oscillator (LO) signal via connection 212 and provides an intermediate frequency (IF) output via connection 214. The switching core 306 switches the current on connection 304 to create harmonics that are filtered out by the load 308 resulting in the IF signal on connection 214, which is supplied to the IF VGA 220 of FIG. 2.

Figure 4:
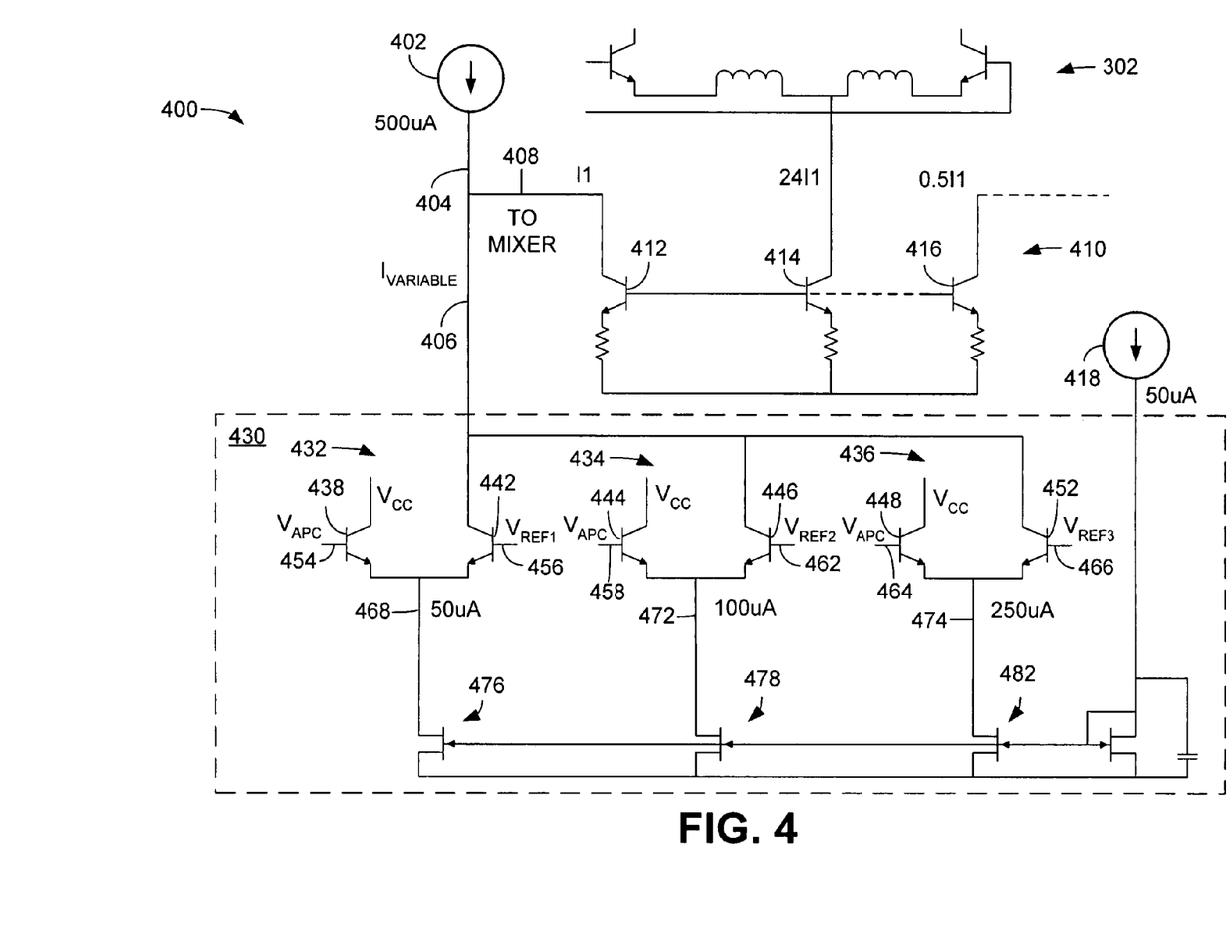
FIG. 4 is a schematic diagram illustrating the dynamic biasing circuitry of the mixer of FIG. 3.

FIG. 4 is a schematic diagram 400 illustrating a circuit 400 to reduce the current supplied to the mixer based on the level of the power amplifier control signal $V_{APC}$. The circuit 400 comprises a current source 402, a reference current source 418, a $g_m$ stage 302 (represented schematically), and a circuit 410 used to develop the current that is supplied to the $g_m$ stage 302. In accordance with this embodiment of the invention, a weighted current circuit 430 coupled to connection 406 can adjustably, and variably control the amount of current supplied to the $g_m$ stage 302 by diverting current from the current source 402, thereby reducing the amount of current supplied to the $g_m$ stage 302 in the mixer. Diverting current from the current source 402 controls the amount of current supplied to the $g_m$ stage 302 via connection 408. The current on connection 406 is referred to as $I_{VARIABLE}$.

The weighted current circuit 430 comprises a plurality of differential pair circuit elements, implemented in this example using transistors, configured to reduce the current supplied to the mixer 300 with respect to the level of the $V_{APC}$ signal. The $V_{APC}$ control range is divided into segments. In each segment a differential pair is used to compare the power control signal $V_{APC}$ with a reference voltage signal and to alter the mixer current proportionally with respect to the level of the $V_{APC}$ signal. For example, the circuit 430 comprises a differential pair 432, a differential pair 434, and a differential pair 436. The differential pair 432 comprises a transistor 438 and a transistor 442, connected as an adjustable current source. The transistor 438 receives the $V_{APC}$ signal as an input on connection 454 and the transistor 442 receives a voltage reference signal $V_{REF1}$ as an input on connection 456. The output of the differential pair 432 on connection 468 is supplied to transistor 476. Similarly, the differential pair 434 comprises a transistor 444 and a transistor 446. The transistor 444 receives as an input the $V_{APC}$ signal on connection 458, while the transistor 446 receives a voltage reference signal $V_{REF2}$ on connection 462. The output of the differential pair 434 on connection 472 is supplied to transistor 478. The differential pair 436 comprises a transistor 448 and a transistor 452. The input to the transistor 448 is the $V_{APC}$ signal on connection 464 while the input to the transistor 452 is the voltage reference signal $V_{REF3}$ on connection 466. The output of the differential pair 436 is supplied via connection 474 to the transistor 482. The differential pairs 432, 434 and 436 are each referred to as an adjustable current source, or can also be an adjustable current draw.

In one embodiment, the reference voltage signal $V_{REF1}$ supplied on connection 4564 is 1350 millivolts (mV), the reference voltage signal $V_{REF2}$ supplied on connection 462 is 1450 millivolts (mV), and the reference voltage signal $V_{REF3}$ supplied on connection 466 is 1550 millivolts (mV). The reference voltages can be created using a resistive network coupled to a bandgap voltage source (not shown).

The differential pairs 432, 434, and 436 can be implemented using, for example, bipolar heterojunction transistor (BHBT) technology, or can be implemented using complimentary metal oxide semiconductor (CMOS) or bi-CMOS technology. Each differential pair 432, 434, and 436 is implemented to draw a different amount of current from the current source 402. The summation of the current drawn by the differential pairs 432, 434 and 436 appears on connection 406. For example, the components comprising the differential pair 432 can be chosen to draw 50 micro amps (µA), the components in the differential pair 434 can be chosen to draw 100 µA, and the components in the differential pair 436 can be chosen to draw 250 µA. By selectively activating some or all of the differential pairs 432, 434, and 436, the current drawn off node 404 by the circuit 430 can be varied to reduce the amount of current supplied to the $g_m$ stage 302 on connection 408, based on the level of the $V_{APC}$ signal. It should be mentioned that the specific implementation detail shown in FIG. 4 is one manner of implementing the adjustable bias mixer circuitry. For example, the current source 402 can alternatively be implemented as an adjustable current source in which the amount of current supplied to the $g_m$ stage 302 on connection 408 can be varied. The transistors 476, 478 and 482 comprise a binary weighted current mirror to mirror the current of the reference current source 418. However, other weighting methodologies may also be used.

Figure 5:
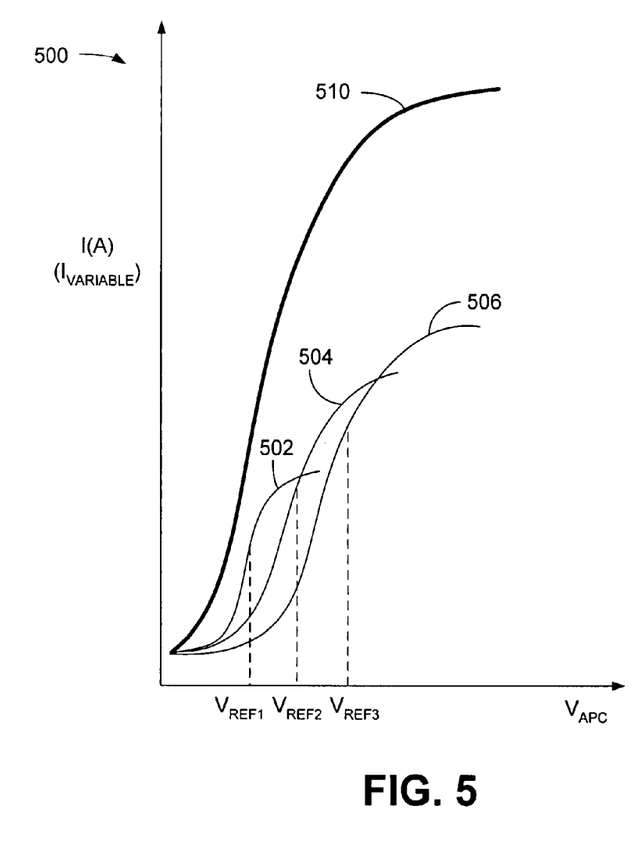
FIG. 5 is a graphical illustration of control curves provided by the circuit of FIG. 4.

FIG. 5 is a graphical illustration depicting the current through the differential pairs 432, 434, and 436 of FIG. 1. The horizontal axis represents $V_{APC}$ and the vertical axis represents the variable current, $I_{VARIABLE}$, on connection 406 (FIG. 4). For example, the curve 502 corresponds to the control curve provided by the differential pair 432, the curve 504 corresponds to the control curve provided by the differential pair 434, and the curve 506, represents the control curve provided by the differential pair 436. The curve 510 represents a summation of the curves 502, 504, and 506, and is not shown to scale in FIG. 5. The current, $I_{VARIABLE}$, on connection 406 is subtracted from the current source 402 effectively reducing the current $I_1$ on connection 408 that will be supplied to the $g_m$ stage 302.

Figure 6:
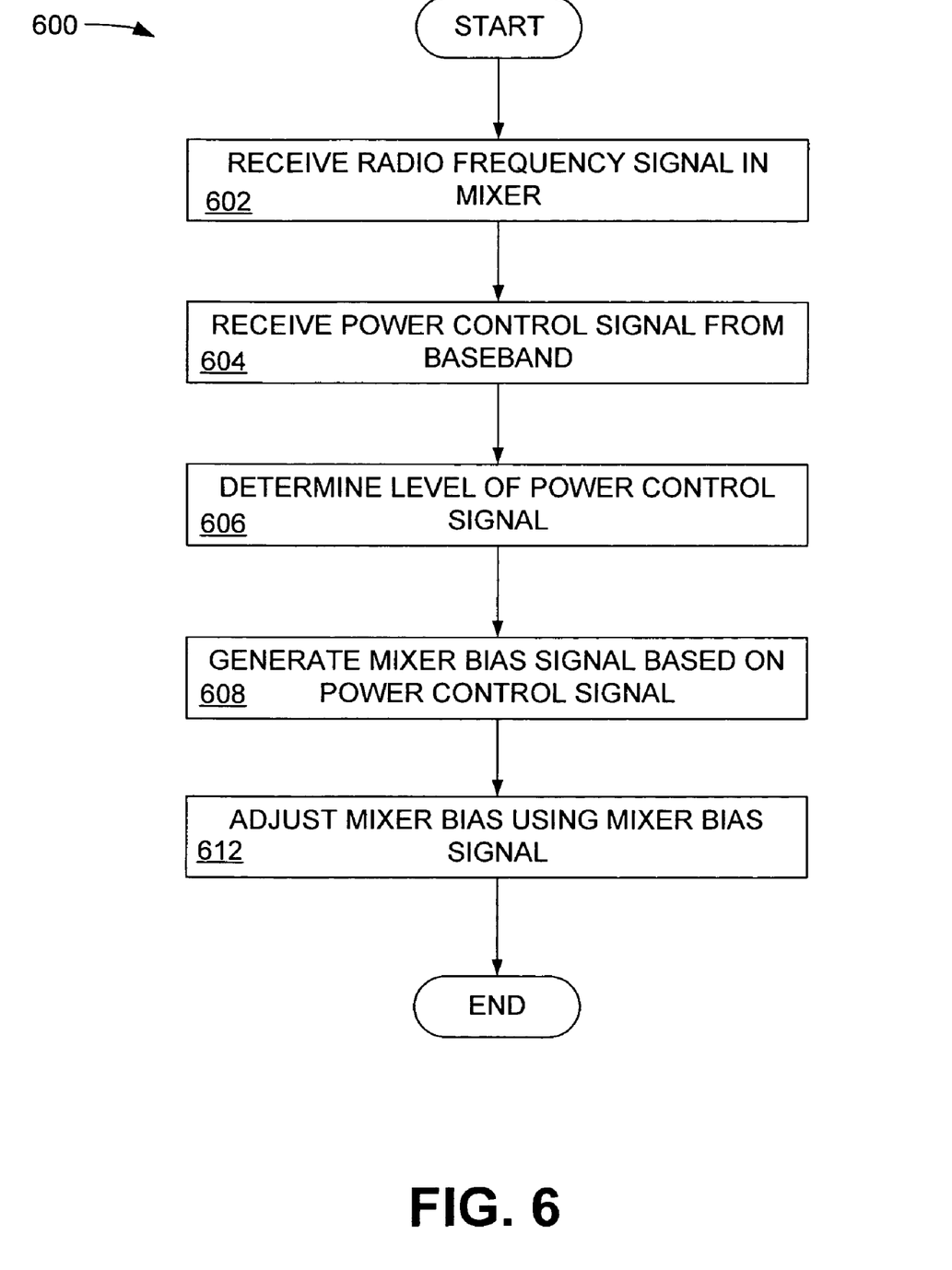
FIG. 6 is a flowchart illustration the operation of the dynamic biasing circuit of FIG. 4.

FIG. 6 is a flow chart 600 describing the operation of an embodiment of the mixer having dynamic biasing. In block 602 an RF signal is received in the mixer 300. In block 604 a power control signal, such as $V_{APC}$ is received by the power amplifier control element 200. In block 606, the power level of the $V_{APC}$ signal is determined. In block 608, the level of the mixer bias signal that corresponds to the power control signal in block 606 is generated by the circuitry in FIG. 4. In block 612, the bias signal (current) to the mixer 300 is controlled using the mixer bias signal generated in block 608.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for dynamically biasing a mixer in a transmitter, comprising:
   providing a radio frequency (RF) signal to a mixer in a power amplifier control loop, wherein the power amplifier control loop is configured to control output power of a power amplifier located in a transmitter;
   providing a local oscillator (LO) signal to the mixer, wherein the mixer is configured to mix the RF signal with the LO signal;

providing a mixer bias control signal to the mixer, wherein a bias level of the mixer is responsive to the mixer bias control signal;

providing a power control signal to a variable gain amplifier in the power amplifier control loop, wherein the power control signal controls output power of the variable gain amplifier; and using a baseband voltage of the power control signal to change an amplitude of a current of the mixer bias control signal using a linear-in-dB function to reduce mixer current in a dB per dB relationship with respect to the output power of the power amplifier during low power operation.

2. The method of claim 1, wherein a voltage of the power control signal has a linear-in-dB relationship with the output power of the power amplifier.

3. The method of claim 1, wherein the current of the mixer bias control signal has a linear-in-dB relationship with the output power of the power amplifier.

4. The method of claim 1, further comprising: using a plurality of differential pair transistors to change the amplitude of the current of the mixer bias control signal responsive to the power control signal.

5. The method of claim 4, wherein a current drawn by each of the plurality of differential pair transistors is responsive to a voltage of the power control signal.

6. The method of claim 5, wherein each pair of the plurality of differential pair transistors is configured to draw a different amount of current from a current source used to provide the current of the mixer bias control signal.

7. A system comprising:
a power amplifier located in a transmitter;
a power amplifier control loop that includes a mixer and a variable gain amplifier, the power amplifier control loop configured to control output power of the power amplifier, the output power of the variable gain amplifier responsive to a power control signal, the mixer configured to mix a radio frequency (RF) signal with a local oscillator (LO) signal, a bias level of the mixer responsive to a mixer bias control signal; and wherein the system is configured such that a baseband voltage of the power control signal controls an amplitude of a current of the mixer bias control signal using a linear-in-dB function to reduce mixer current in a dB per dB relationship with respect to the output power of the power amplifier during low power operation.

8. The system of claim 7, wherein a voltage of the power control signal has a linear-in-dB relationship with the output power of the power amplifier.

9. The system of claim 7, wherein the current of the mixer bias control signal has a linear-in-dB relationship with the output power of the power amplifier.

10. The system of claim 7, further comprising a plurality of differential pair transistors, wherein a current drawn by each of the plurality of differential pair transistors is responsive to a voltage of the power control signal.

11. The system of claim 7, further comprising a plurality of differential pair transistors configured to change the amplitude of the current of the mixer bias control signal responsive to the power control signal.

12. The system of claim 7, further comprising a plurality of differential pair transistors, wherein each pair of the plurality of differential pair transistors is configured to draw a different amount of current from a current source used to provide the current of the mixer bias control signal.

13. The system of claim 7, wherein the system is a wireless communication device.

* * * * *